(12) United States Patent
Ahn et al.

(10) Patent No.: US 6,661,058 B2
(45) Date of Patent: Dec. 9, 2003

(54) HIGHLY RELIABLE GATE OXIDE AND METHOD OF FABRICATION

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/068,836

(22) Filed: Feb. 11, 2002

(65) Prior Publication Data

US 2002/0155689 A1 Oct. 24, 2002

Related U.S. Application Data

(62) Division of application No. 09/838,335, filed on Apr. 20, 2001, now Pat. No. 6,514,828.

(51) Int. Cl.[7] .......................... H01L 21/94; H01L 21/76; H01L 31/119
(52) U.S. Cl. .................. 257/344; 257/403; 257/411
(58) Field of Search ..................... 257/344, 408, 257/411, 346, 336, 900, 369, 322

(56) References Cited

U.S. PATENT DOCUMENTS

| 6,087,243 A | 7/2000 | Wang |
| 6,153,538 A | 11/2000 | An |

OTHER PUBLICATIONS

B. H. Lee, et al.—"Ultrathin Hafnium Oxide with Low Leakage and Excellent Reliability for Alternative Gate Dielectric Application," IEEE 1999, pp. 133–136.

"High–Density Silicon Oxide Grown at Low–Temperature by Atomic Oxygen Generated in High–Density Krypton Plasma" by Yuji Saito, et al, Extended Abstracts of the 1999 International Conference on Solid State Device and Materials, Tokyo, 1999, pp. 152–153*.

"Low–Temperature Growth of High–Integrity Silicon Oxide Films by Oxygen Radical Generated in High–Density Krypton Plasma" by Masaki Hirayama, et al, 1999 IEEE pp. 249–252*.

"Advantage of Radical Oxidation for Improving Reliability of Ultra–Thin Gate Oxide" by Yuji Saito, et al, 2000 IEEE, pp 176–177*.

*Primary Examiner*—John F. Niebling
*Assistant Examiner*—Walter L. Lindsay, Jr.
(74) *Attorney, Agent, or Firm*—Dickstein Shipiro Morin & Oshinsky LLP

(57) ABSTRACT

An ultra-thin gate oxide layer of hafnium oxide ($HfO_2$) and a method of formation are disclosed. The ultra-thin gate oxide layer of hafnium oxide ($HfO_2$) is formed by a two-step process. A thin hafnium (Hf) film is first formed by thermal evaporation at a low substrate temperature, after which the thin hafnium film is radically oxidized using a krypton/oxygen ($Kr/O_2$) high-density plasma to form the ultra-thin gate oxide layer of hafnium oxide ($HfO_2$). The ultra-thin gate oxide layer of hafnium oxide ($HfO_2$) formed by the method of the present invention is thermally stable in contact with silicon and is resistive to impurity diffusion at the $HfO_2$/silicon interface. The formation of the ultra-thin gate oxide layer of hafnium oxide ($HfO_2$) eliminates the need for a diffusion barrier layer, allows thickness uniformity of the field oxide on the isolation regions and, more importantly, preserves the atomically smooth surface of the silicon substrate.

36 Claims, 6 Drawing Sheets

HIGHLY RELIABLE GATE OXIDE AND METHOD OF FABRICATION

This application is a divisional of application Ser. No. 09/838,335, filed on Apr. 20, 2001, now U.S. Pat. No. 6,514,828 which is hereby incorporated by reference.

BACKGROUND OF THE INVENTION

The present invention relates generally to semiconductor devices and, in particular, to ultra-thin gate oxide memory devices.

BRIEF SUMMARY OF THE INVENTION

A conventional metal-oxide-semiconductor (MOS) device is illustrated in FIG. 1. The device generally includes a gate electrode 20 which acts as a conductor to which an input signal is typically applied via a gate terminal (not shown). Conventionally. doped active areas 14 and 16 are formed within the semiconductor substrate 10 and act as source and drain regions 14 and 16, respectively. A channel region 12 is formed in the semiconductor substrate 10 beneath the gate electrode 20 and separates the source/drain regions 14, 16. The channel region 12 is typically doped with a dopant opposite to that of the doped source/drain regions 14, 16. The gate electrode 20 is separated from the semiconductor substrate 10 by an insulating gate oxide layer 18, which is typically an oxide of silicon, for example silicon dioxide ($SiO_2$). The gate oxide layer 18 prevents current from flowing between the gate electrode 20 and the semiconductor source region 14, the drain region 16 and/or the channel region 12.

When an input voltage is applied to the gate electrode 20, a transverse electrical field is set up in the channel region 12. By varying the transverse electrical field, the conductance of the channel region 12 between the source region 14 and the drain region 16 is modulated. This way, an electric field controls the current flow through the channel region 12. This type of device is commonly known as an MOS field-effect-transistor (MOSFET).

The growth of the gate oxide layer, such as the gate oxide layer 18 of FIG. 1, is a critical step in manufacturing miniaturized semiconductor devices. Thin gate oxide layers free of defects and of high quality without contamination are essential for proper device operation, especially when current design rules demand gate oxide layers with thicknesses of less than 15 Angstroms, and even less than 10 Angstroms. To obtain high-quality gate oxide layers, the surface of the active area of the device is typically treated with a wet etch to remove any residual oxide. The gate oxide is then grown slowly, typically through dry oxidation in a chlorine ambient. At this point, it is extremely important to carefully control the growth of the gate oxide because the thickness and uniformity of the gate oxide layer can significantly impact the overall operation of the device formed. Because the drain current in a MOS device is inversely proportional to the thickness of the gate oxide, it is desirable to make the gate oxide as thin as possible while taking into account the oxide breakdown and reliability considerations of the process. Furthermore, the use of silicon dioxide for gate oxide layers thinner than 20 Angstroms poses various problems, one of them being the leakage current caused by direct tunneling, which further affects the operation of the device.

High-dielectric constant insulating materials have been proposed as gate oxide layers, but with limited results. FIG. 2 illustrates a high-dielectric constant insulating layer 19 formed between the gate electrode 20 and the semiconductor substrate 10. Conventional high-dielectric constant insulating materials such as tantalum oxide ($Ta_2O_5$), titanium oxide ($TiO_2$) or barium oxide (BaO), for example, are not thermally stable when in direct contact with a silicon substrate. Accordingly, these high-dielectric constant insulating materials require a diffusion barrier layer 21 (FIG. 2) at the interface with the silicon substrate, the formation of which adds process complexity.

Furthermore, using a diffusion barrier layer defeats the purposes of using a high-dielectric constant insulating material because the gate capacitance is decreased rather than increased. If the gate structure of FIG. 2 is viewed as a series of stacked capacitors 25 (FIG. 3), which has layers of thicknesses comparable to those of the gate structure of FIG. 2, then, a first capacitor $C_1$ (FIG. 3) corresponds to the high-dielectric constant insulating layer 19 and a second capacitor $C_2$ (FIG. 3) corresponds to the diffusion barrier layer 21. The diffusion barrier layer 21 (FIG. 2) acts as a series capacitor the addition of which decreases the capacitance of the gate electrode 20. The capacitance of the first capacitor $C_1$ is larger than the capacitance of the second capacitor $C_2$ and, thus, voltage $V_1$ which occurs across the first capacitor $C_1$ is smaller than voltage $V_2$ which occurs across the second capacitor $C_2$. As a result, the applied voltage V that occurs across the series capacitors 25, that is the sum of $V_1$ and $V_2$, appears mostly across the diffusion barrier layer 21 rather than across the high-dielectric constant insulating layer 19.

Accordingly, there is a need for an improved memory device which eliminates the problems posed by the use of a conventional high-dielectric constant insulating materials as gate oxide layers. There is also a need for an improved ultrathin gate oxide layer which is thermally stable when in contact with silicon and which is resistive to impurity diffusion, and a novel method for its fabrication. A memory device with a minimal voltage drop across the gate electrode is also desirable, as well as a method of forming such a memory device.

SUMMARY OF THE INVENTION

The present invention provides an ultra-thin gate oxide layer of hafnium oxide ($HfO_2$) as a thin medium-dielectric constant gate insulating layer. The ultra-thin gate oxide layer of hafnium oxide ($HfO_2$) is formed by a two-step process: (1) a thin hafnium (Hf) film is formed by thermal evaporation at a low substrate temperature, after which (2) the thin hafnium film is radically oxidized using a krypton/oxygen ($Kr/o_2$) high-density plasma to form the ultra-thin gate oxide layer of hafnium oxide ($HfO_2$). The ultra-thin gate oxide layer of hafnium oxide ($HfO_2$) formed by the method of the present invention is thermally stable in contact with silicon and is resistive to impurity diffusion at the $HfO_2$/silicon interface. The formation of the ultra-thin gate oxide layer of hafnium oxide ($HfO_2$) eliminates the need for a diffusion barrier layer, allows thickness uniformity of the field oxide on the isolation regions and, more importantly, preserves the atomically smooth surface of the silicon substrate.

These and other advantages and features of the invention will be more clearly understood from the following detailed description which is provided in connection with the accompanying drawings.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that various structural, logical, and electrical changes may be made without departing from the spirit or scope of the invention.

The term "substrate" used in the following description may include any semiconductor-based structure that has an exposed substrate surface. Structure must be understood to include silicon-on insulator (SOI), silicon-on sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The term "hafnium" is intended to include not only elemental hafnium, but hafnium with other trace metals or in various alloyed combinations with other metals as known in the semiconductor industry, as long as such hafnium alloy is conductive, and as long as the physical and electrical properties of the hafnium remain unchanged. Similarly, the term "hafnium oxide" is intended to include not only elemental hafnium oxide, but hafnium oxide with other trace metals or in various alloyed combinations with other metals as known in the semiconductor industry, as long as the physical and electrical properties of the hafnium oxide remain unaltered.

The present invention provides an improved memory device comprising gate structures including an ultra-thin medium-dielectric constant gate insulator formed of hafnium oxide. The ultra-thin medium-dielectric constant gate insulator of the invention reduces the voltage drop across the gate electrode, preserves the smoothness of the substrate surface and permits effective transistor operations without the need of a diffusion barrier layer.

Figure 1:
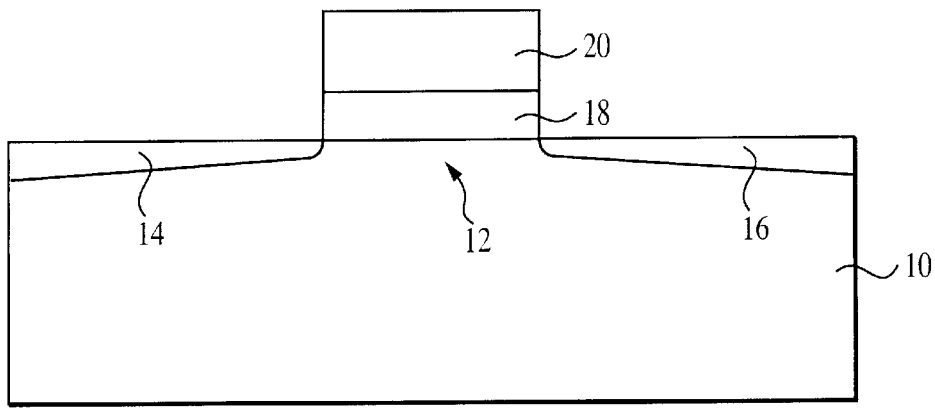
FIG. 1 illustrates a schematic cross-sectional view of a portion of a conventional MOS device formed in accordance with a method of the prior art.
Figure 2:
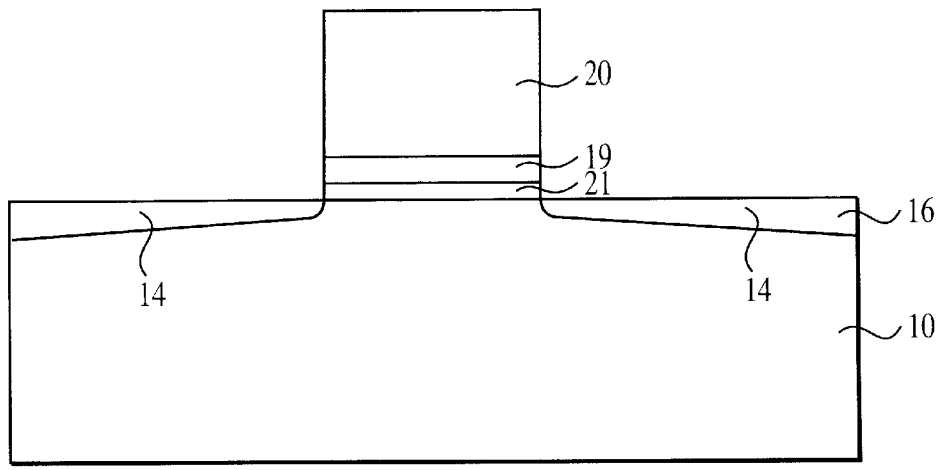
FIG. 2 illustrates a schematic cross-sectional view of a portion of a conventional MOS device formed in accordance with another method of the prior art.
Figure 3:
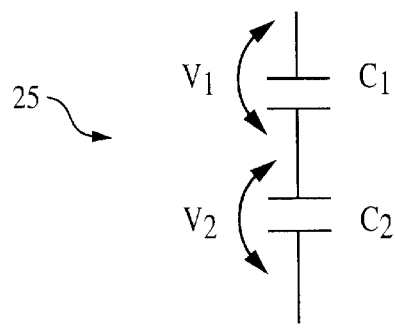
FIG. 3 is a schematic view of a series of capacitors corresponding to stacked layers of the structure of FIG. 2.
Figure 4:
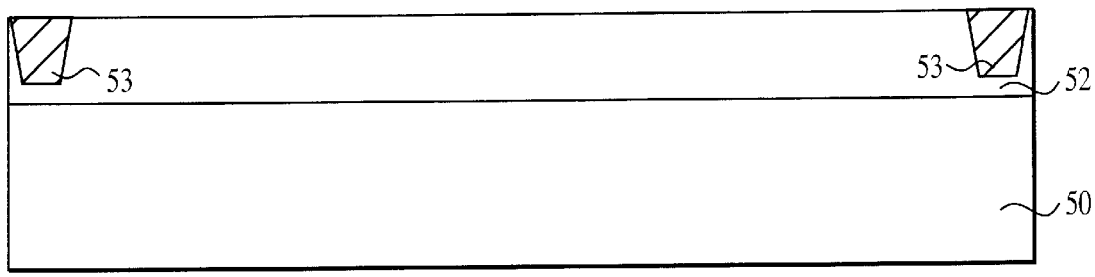
FIG. 4 illustrates a schematic cross-sectional view of a portion of a memory device formed according to a method of the present invention.

Referring now to the drawings, where like elements are designated by like reference numerals, FIGS. 4–13 illustrate the formation of one embodiment of an improved memory device 100 (FIG. 13) of the present invention. FIG. 4 illustrates a semiconductor substrate 50 having a well 52, which is typically doped to a predetermined conductivity, for example P-type or N-type, depending on whether NMOS or PMOS transistors will be formed therein. For the purposes of the present invention, the well 52 is considered to be a P-well formed by implanting P-type impurity atoms, such as boron, for example, by known methods of the art. In this application, the semiconductor substrate 50 will be referred to as a P-type silicon substrate 50, but it must be understood that the substrate need not be silicon-based. Thus, the present invention has equal applicability to other semiconductor substrates, such as, for example, silicon-germanium, germanium, silicon-on-saphire, or gallium-arsenide substrates, among others.

The structure of FIG. 4 further includes isolation regions 53, which, as known in the art, may be field oxide (FOX) regions formed by a shallow trenches for isolation (STI) process, for example. In an exemplary embodiment, the isolation regions 53 are shallow trenches for isolation filled with high density plasma (HDP) oxide, a material which has a high ability to effectively fill narrow trenches. Alternatively, an insulating layer (not shown) formed of an oxide or of silicon nitride, for example, may be formed on the trench sidewalls, prior to filling the trenches with the isolation dielectric, to aid in smoothing out the corners in the bottom of the trenches and to reduce the amount of stress in the dielectric used to later fill in the trenches.

Figure 5:
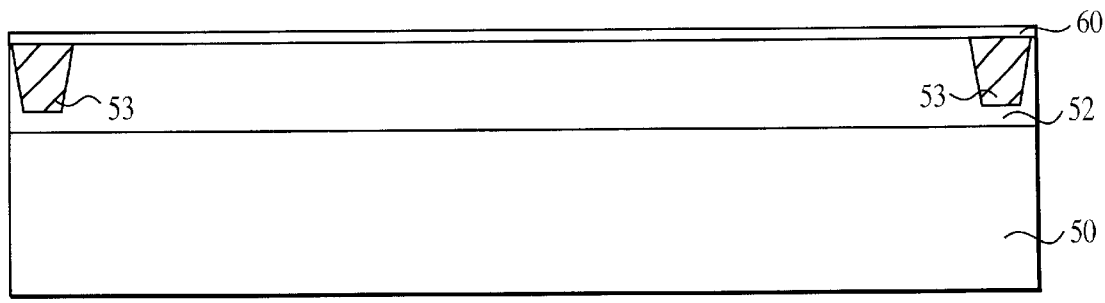
FIG. 5 illustrates a schematic cross-sectional view of the memory device of FIG. 4 at a stage of processing subsequent to that shown in FIG. 4.

Subsequent to the formation of the isolation regions 53 (FIG. 4), an ultra-thin layer of insulating material 60 of hafnium (HfO is formed over the silicon substrate 50 including the isolation regions 53, as shown in FIG. 5. Hafnium is the preferred material for the insulating material 60 because, as it will be explained in more detail below, hafnium forms the most stable oxide with the highest heat of formation ($\Delta Hf$=271 Kcal/mol) among the elements of group IVA of the periodic table (Ti, Zr, Hf). Hafnium can also reduce the native silicon dioxide ($SiO_2$) layer to form hafnium oxide ($HfO_2$). Hafnium is further preferred because hafnium oxide ($HfO_2$) has a medium-dielectric constant (k) of about 30 with a bandgap of 5.68 eV. Hafnium oxide ($HfO_2$) is very resistive to impurity diffusion and intermixing at the interface $HfO_2$/silicon because of its high density, which is of about 9.69 $g/cm^3$.

In a preferred embodiment of the invention, the ultra-thin hafnium layer 60 (FIG. 5) is formed by thermal evaporation, for example by electron-beam evaporation, using an ultra-high purity Hf metal slug, of about 99,9999% purity, and at a low temperature substrate of about 150° C. to about 200° C. The ultra-thin hafnium layer 60 is formed over the whole surface of the silicon substrate 50, including the isolation regions 53, to a thickness of about 10 Angstroms to about 100 Angstroms, more preferably of about 10 Angstroms to about 50 Angstroms.

The formation of the ultra-thin hafnium layer 60 (FIG. 5) by a method of the present invention has advantages over conventional deposition techniques. Conventional hafnium metal deposition processes of the prior art include reactive sputtering, such as magnetron sputtering in an argon/oxygen ambient or in an argon ambient, during which ion bombardment damages the surface of the silicon substrate. In contrast, the formation of the ultra-thin hafnium layer 60 by thermal evaporation preserves the original atomically smooth surface of the silicon substrate 50. Preservation of the smoothness of a silicon surface is an important property in the semiconductor industry, as the roughness of the substrate surface has been recently related to the leakage current. In a recent article, *The electronic structure of the atomic scale of ultrathin gate oxides*, Nature, Vol. 399, 1999, pp. 753–761, Muller et al. have emphasized that a fundamental characteristic of an ultra-thin gate oxide layer is the ability of the oxide to control the roughness of the oxide/silicon interface at an atomic scale. Muller et al. have demonstrated that the leakage current through a 10 Angstroms oxide increases by about a factor of 10 for every 0.1 Angstroms increase in the root-mean-square (rms) roughness. The leakage current in conjunction with the subthreshold leakage are the most important characteristics of MOSFET devices. Thus, the method of the present invention for forming the ultra-thin hafnium layer 60 of FIG. 5 avoids damage of the silicon substrate 50, preserves the originally atomically smooth surface of the silicon substrate 50 and, therefore, reduces the leakage current.

Subsequent to the formation of the ultra-thin hafnium layer 60 (FIG. 5), an ultra-thin hafnium gate oxide ($HfO_2$) layer 62 (FIG. 6) is formed by oxidation of the ultra-thin hafnium layer 60. In a preferred embodiment of the invention, the ultra-thin hafnium layer 60 is oxidized at low temperatures by atomic oxygen generated in a high-density krypton (Kr) plasma. Precise details of a silicon oxidation technique, which can be employed for the hafnium oxidation of the present invention, were given recently by Saito et al., in *High-Intergity Silcion Oxide Grown at Low-Temperature by Atomic Oxygen Generated in High-Density Krypton Plasma*, Extended Abstracts of the 1999 Int'l Conference on Solid State Devices and Materials, (Tokyo, 1999), pp. 152–53, the disclosure of which is incorporated by reference herein. However, a brief summary of how an ultra-thin gate oxide layer is formed by atomic oxygen generated in a high-density krypton (Kr) plasma is believed to be helpful to the understanding of the present invention.

As Saito et al. have reported, silicon dioxide films were grown by direct oxidation of a silicon surface at about 400° C. and at low electron temperature (below 1.3 eV), low ion bombardment energy (less than 7 eV) and high plasma density (above $10^{12}/cm^3$). A mixed gas of about 3% oxygen in krypton ($O^2/Kr$) was used at a pressure of 1 Torr and a microwave density of about 5 W/cm². The typical growth rate of the silicon oxide was 14 Angstroms for about 10 minutes. In *Low-Temperature Growth of High-Intergity Silicon Oxide Films by Oxygen Radial Generated in High-Density Krypton Plasma*, IEEE Tech. Dig., 1999, pp. 249–252, Hirayama et al. further analyzed film growth in $O_2/Kr$ plasma and demonstrated that the oxidation rate of $O_2/Kr$ plasma is faster than the oxidation rate of an $O_2/He$ plasma. Hirayama et al. also showed that the growth rate of $O_2/Kr$ mixed plasma is higher than the growth rate of thermally grown silicon oxide films at 1000° C.

Figure 6:
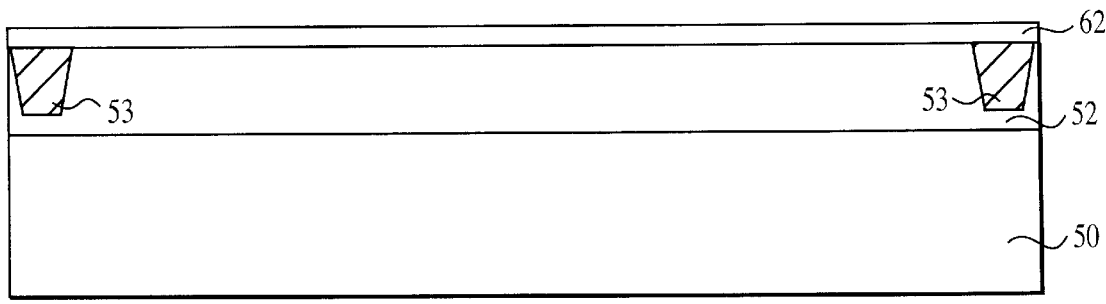
FIG. 6 illustrates a schematic cross-sectional view of the memory device of FIG. 4 at a stage of processing subsequent to that shown in FIG. 5.

In accordance with the findings of Saito et al. and Hirayama et al., the ultra-thin hafnium layer 60 (FIG. 5) undergoes oxidation in a high-density microwave 3% oxygen/krypton ($O_2/Kr$) plasma at a temperature of about 400° C. to form the ultra-thin hafnium gate oxide ($HfO_2$) layer 62 of FIG. 6. The ultra-thin hafnium gate oxide ($HfO_2$) formed by the method of the present invention has a high growth rate, high dielectric strength, and low interface trap and bulk charge. Furthermore, according to the findings of Saito et al., the ultra-thin hafnium gate oxide ($HfO_2$) can displace native thermally grown silicon dioxide.

Another advantage of using the oxygen/krypton ($O_2/Kr$) plasma for the oxidation of the ultra-thin hafnium layer 60 of FIG. 5 is that the thickness variation of the ultra-thin hafnium gate oxide ($HfO_2$) layer 62 (FIG. 6) at the edges of the isolation regions 53 (FIG. 6) is dramatically improved compared with the thickness variation of conventional thermal oxidation processes. This is because the oxide growth in an oxygen/krypton ($O_2/Kr$) plasma does not depend on surface orientation and oxygen radicals can penetrate any place, even very complicated structures, due to their very small atomic radius. These findings have been reported by Saito et al. in *Advantage of Radical Oxidation for Improving Reliability of Ultra-Thin Gate Oxide*, VLSI Tech. Dig., (2000 Symposium on VLSI Technology Digest of Technical Papers), 2000, pp. 176–77, the disclosure of which is incorporated by reference herein. Accordingly, the radical oxidation of the ultra-thin hafnium layer 60 of FIG. 5 may be conducted on a silicon surface of any orientation, for example on a silicon surface of <111> orientation, and the invention is not limited to a silicon surface of <100> orientation which is characteristic to the thermal oxidation processes of the prior art.

Figure 7:
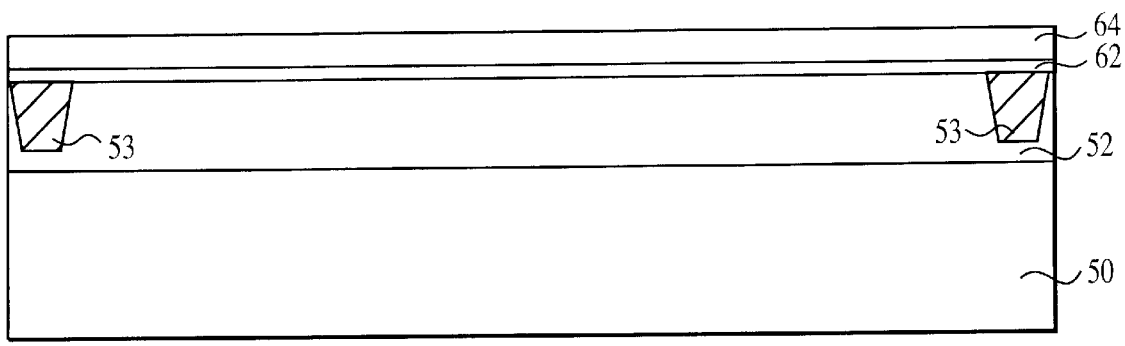
FIG. 7 illustrates a schematic cross-sectional view of the memory device of FIG. 4 at a stage of processing subsequent to that shown in FIG. 6.

After the formation of the ultra-thin hafnium gate oxide ($HfO_2$) layer 62 (FIG. 6), a conductive layer 64 is formed over the ultra-thin hafnium gate oxide ($HfO_2$) layer 62, as shown in FIG. 7. The conductive layer 64 may be formed, for example, of doped polysilicon, metals, metal silicides, conductive metal oxides, or combinations of conductive materials, for example, a refractory metal silicide layer overlying a doped polysilicon layer. In any event, the ultra-thin hafnium gate oxide ($HfO_2$) layer 62 acts as an impurity diffusion barrier layer which allows the fabrication of the gate structures 70 (FIG. 11) without the depletion effect.

In an exemplary embodiment of the invention, the conductive layer 64 is formed of polysilicon, which may be deposited over the ultra-thin hafnium gate oxide ($HfO_2$) layer 62 via LPCVD procedures, at a temperature of about 300° C. to about 700° C., and to a thickness of about 100 Angstroms to about 2,000 Angstroms. The polysilicon layer 64 may be doped in situ during deposition with arsine or phosphine in a silane ambient, or the polysilicon layer 64 may be deposited intrinsically and then doped by ion implantation of arsenic or phosphorous ions. After its deposition, the polysilicon layer 64 may be planarized by chemical mechanical polishing (CMP), for example, but other suitable methods could be used also, as desired. In any event, the formation of the ultra-thin hafnium gate oxide ($HfO_2$) layer 62 by the method of the present invention eliminates the need for an additional barrier layer between the ultra-thin hafnium gate oxide ($HfO_2$) layer 62 and the polysilicon layer 64 to prevent reaction between the polysilicon and the hafnium oxide.

Figure 8:
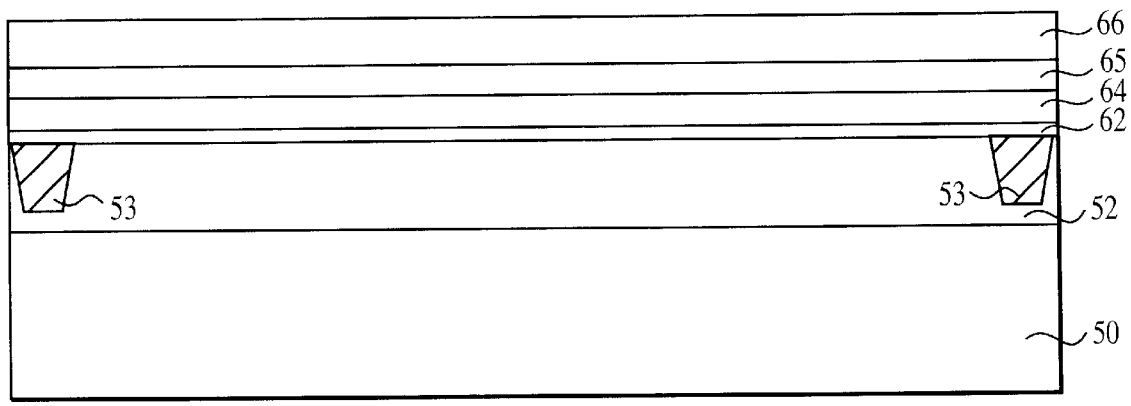
FIG. 8 illustrates a schematic cross-sectional view of the memory device of FIG. 4 at a processing subsequent to that shown in FIG. 7.
Figure 9:
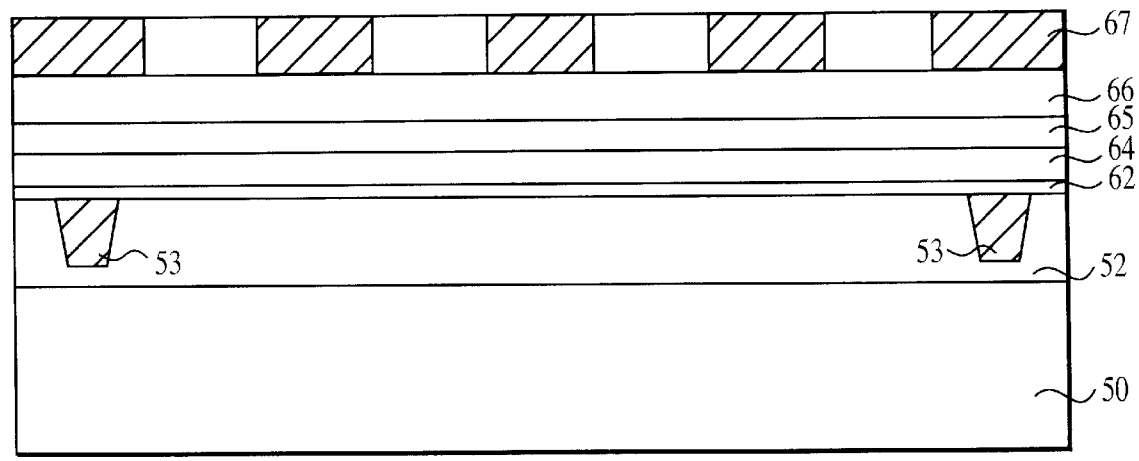
FIG. 9 illustrates a schematic cross-sectional view of the memory device of FIG. 4 at a stage of processing subsequent to that shown in FIG. 8.

In an exemplary embodiment of the invention, silicide regions 65 may be formed over the polysilicon layer 64, as illustrated in FIG. 8. If the silicide regions are desired, a layer of metal capable of forming a silicide (not shown) may be deposited over the polysilicon layer 64 (FIG. 7) by sputtering by RF or DC or by other similar methods such as CVD, to a thickness of about 200 Angstroms to about 500 Angstroms. Subsequent to the deposition of the metal capable of forming a silicide, the silicon substrate 50 undergoes a rapid thermal anneal (RTA), typically for about 10 to 60 seconds, using a nitrogen ambient, at about 600° C. to about 850° C. so that the metal in direct contact with the polysilicon layer 64 is converted to its silicide. As shown in FIG. 8, silicide layer 65 forms a conductive region on top of the polysilicon layer 64. Preferably, the refractory metal has low resistance and low resistivity as a silicide. However, the refractory metal silicide may comprise any refractory metal, including but not limiting to titanium, cobalt, tungsten, tantalum, molybdenum, and platinum.

Although the following processing steps for the completion of the gate stacks 70 (FIG. 11) will refer to and illustrate the silicide layer 65 formed over the polysilicon layer 64, it must be understood that the present invention is not limited to this embodiment, and other embodiments such as the formation of gate stacks without a silicide layer on the polysilicon gate, are also contemplated. A protective cap material 66 is formed over the silicide layer 65 as shown in FIG. 8. The cap material may be formed of silicon dielectrics such as silicon nitride or silicon oxide, but TEOS or carbides may be used also. The cap material 66 may be formed via PECVD deposition procedures, for example, at a temperature between about 300° C. to about 600° C., to a thickness of about 500 Angstroms to about 2,000 Angstroms.

Figure 10:
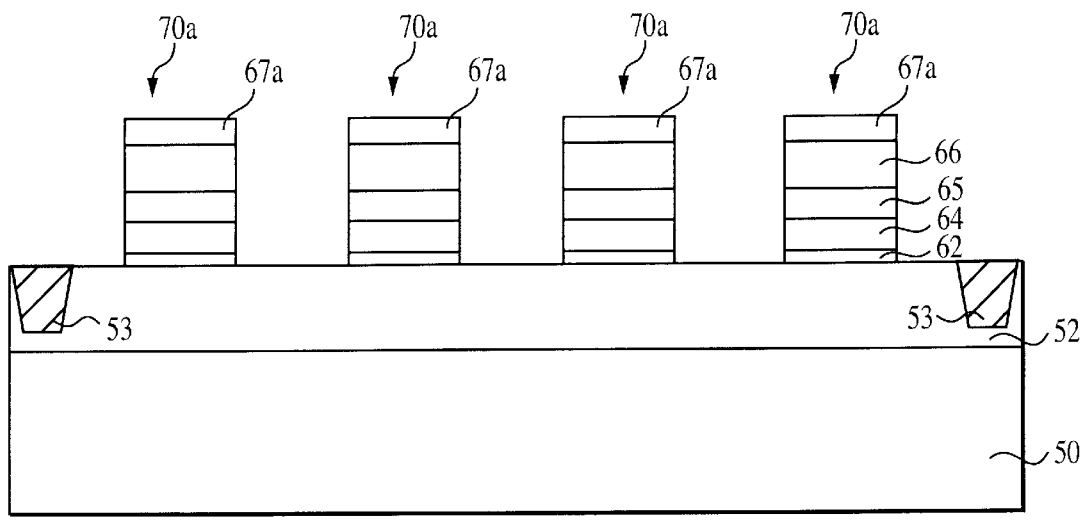
FIG. 10 illustrates a schematic cross-sectional view of the memory device of FIG. 4 at a stage of processing subsequent to that shown in FIG. 9.

Next, the structure of FIG. 8 is patterned using a photoresist layer 67 (FIG. 9) formed over the cap material 66 to a thickness of about 1,000 Angstroms to about 10,000 Angstroms. The photoresist layer 67 is patterned with a mask (not shown) and the ultra-thin hafnium gate oxide (HfO$_2$) layer 62, the polysilicon layer 64, the silicide layer 65 and the cap material 66 are anisotropically etched through the patterned photoresist to obtain a plurality of polysilicon gates 70a having on top portions 67a of the photoresist layer, as shown in FIG. 10. Subsequent to the formation of the polysilicon gates 70a, the top portions 67a of the photoresist layer are removed by conventional techniques, such as oxygen plasma, for example, or by flooding the silicon substrate 50 with UV irradiation to degrade portions 67a of the photoresist layer and obtain gate stacks 70 of FIG. 11.

Figure 11:
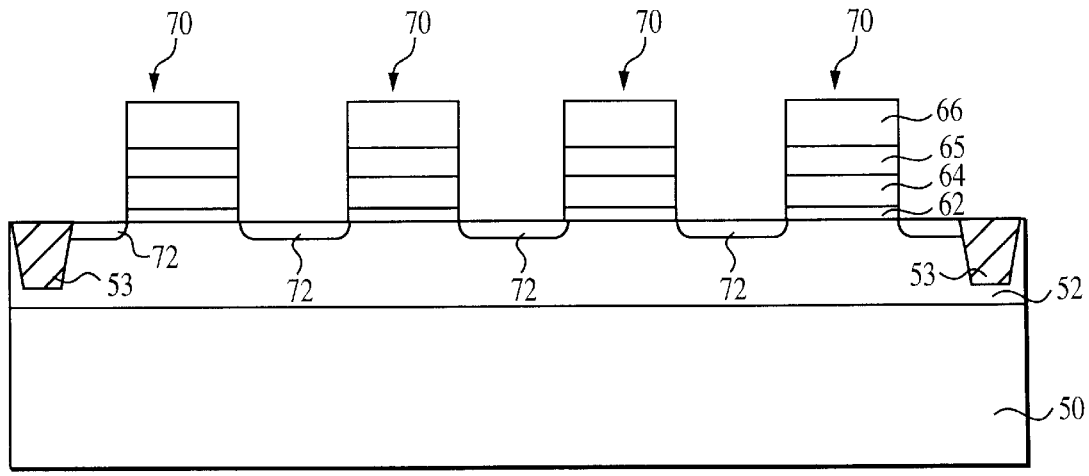
FIG. 11 illustrates a schematic cross-sectional view of the memory device of FIG. 4 at a stage of processing subsequent to that shown in FIG. 10.

As illustrated in FIG. 11, each of the gate stacks 70 comprises the ultra-thin hafnium gate oxide (HfO$_2$) layer 62, the polysilicon layer. 64, the silicide layer 65 and the protective cap material 66. The gate stacks 70 may now be used in a conventional implant process where the gate stacks are needed to mask the dopant implantation of source/drain regions 82 (FIG. 12) of the adjacent transistors defined by the gate stacks. As such, FIG. 11 illustrates the formation of lightly doped drain (LDD) regions 72 in the silicon substrate 50. As known in the art, the LDD regions 72 may be formed by implanting low dosages of conductivity-altering dopants with an LDD mask (not shown) or using the gate stacks 70 as an implantation mask. Thus, in the P-well 52 of the silicon substrate 50, N-type dopants such as arsenic or phosphorous may be implanted at a low energy dose, for example of about $1\times10^{15}$ atoms/cm$^2$, using the gate stacks 70 as a mask.

Figure 12:
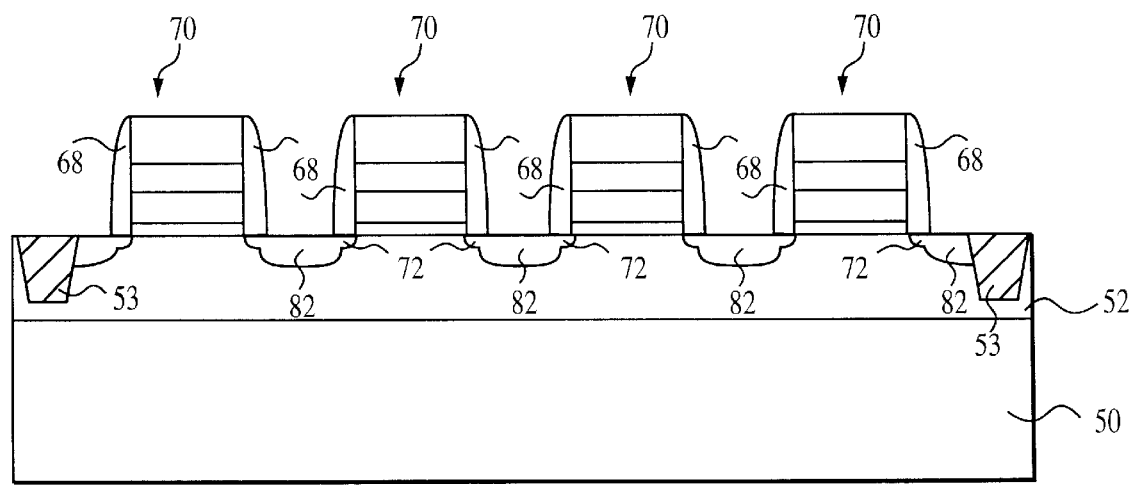
FIG. 12 illustrates a schematic cross-sectional view of the memory device of FIG. 4 at a stage of processing subsequent to that shown in FIG. 11.

The next step in the process flow is the formation of spacers 68 illustrated in FIG. 12. Spacers 68 may be formed, for example, by depositing a silicon nitride film or a silicon oxide material over the structure of FIG. 11 and then anisotropically etching with an RIE plasma to form the spacers 68 on each of the sidewalls of the gate stacks 70.

The gate stacks 70 protected by spacers 68 can now undergo conventional processing steps for the formation of source/drain regions in the silicon substrate 50. As such, using the gate stacks 70 as an implantation mask, heavily doped source/drain regions 82 are formed in the uncovered portions of the silicon substrate 50 via an ion implantation procedure performed at an energy of about 50 KeV to about 70 KeV, and at a dose of about $2\times10^{15}$ to about $5\times10^{15}$ atoms/cm$^2$, using arsenic or phosphorous, for example. Thermal annealing for activation may be carried out in a nitrogen atmosphere at about 1000° C. for about 10 minutes.

Figure 13:
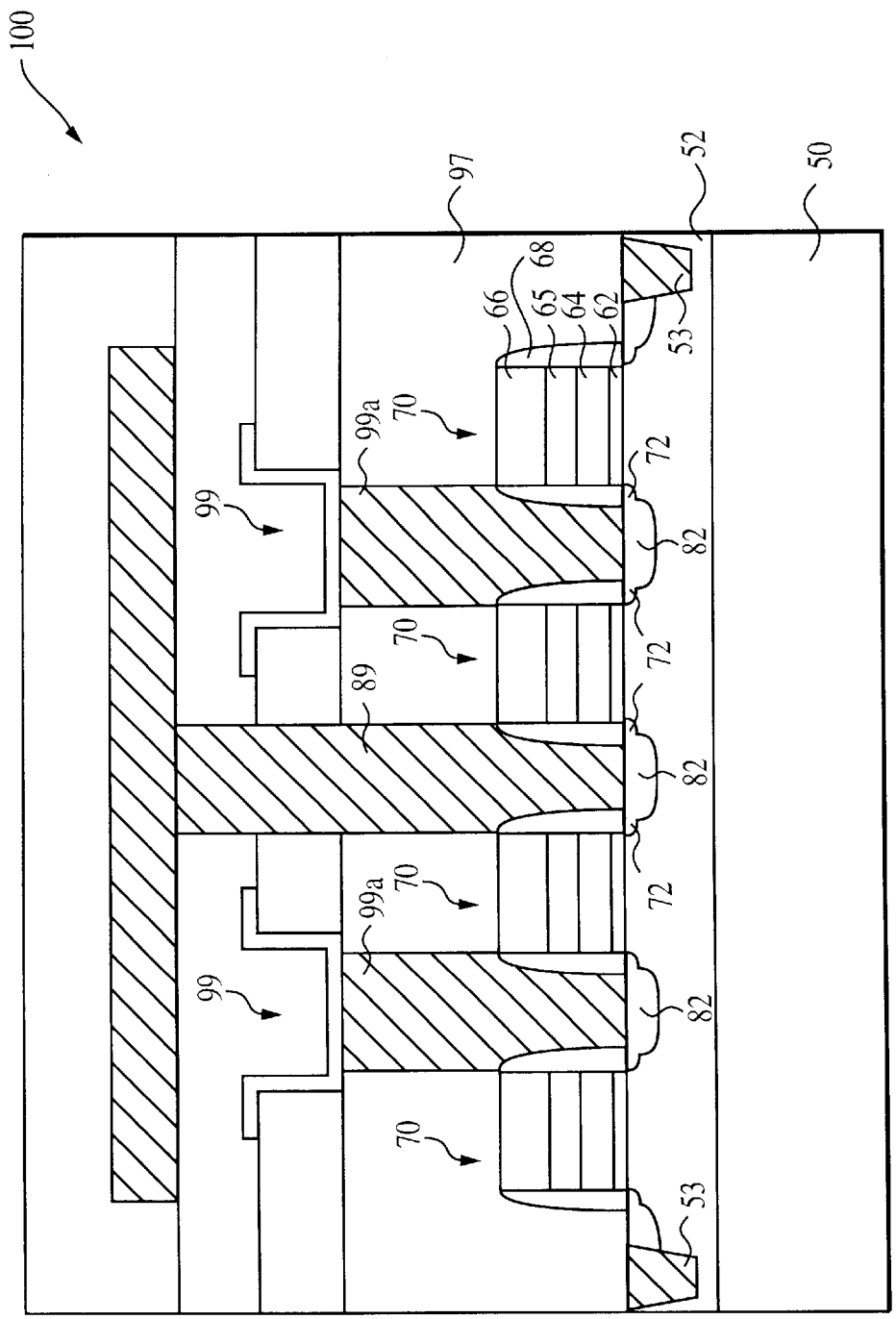
FIG. 13 illustrates a schematic cross-sectional view of the memory device of FIG. 4 at a stage of processing subsequent to that shown in FIG. 12.

Conventional processing steps can now be carried out to form conductors 89 and/or capacitors 99 with associated conductive plugs 99a, all illustrated in FIG. 13, and to complete the formation of a DRAM memory device 100. For this, an insulating layer 97 is formed over the structure of FIG. 12 and contact openings (not shown) are created through the insulating layer 97. The insulating layer 97, may include borophosphosilicate glass (BPSG) or phosphosilicate glass (PSG), for example, and may be formed by normal CVD or LPCVD processes to a thickness of about 1,000 Angstroms to about 5,000 Angstroms. To create contact openings through the insulating layer 97, a photoresist material (not shown) is deposited and patterned using conventional photolithography steps and the insulating layer 97 is then etched, by a wet etch for example, so that the contact openings extend to source/drain regions 82. Conductors 89 and/or associated conductive plugs 99a of capacitors 99 are then formed by known metallization processes.

Figure 14:
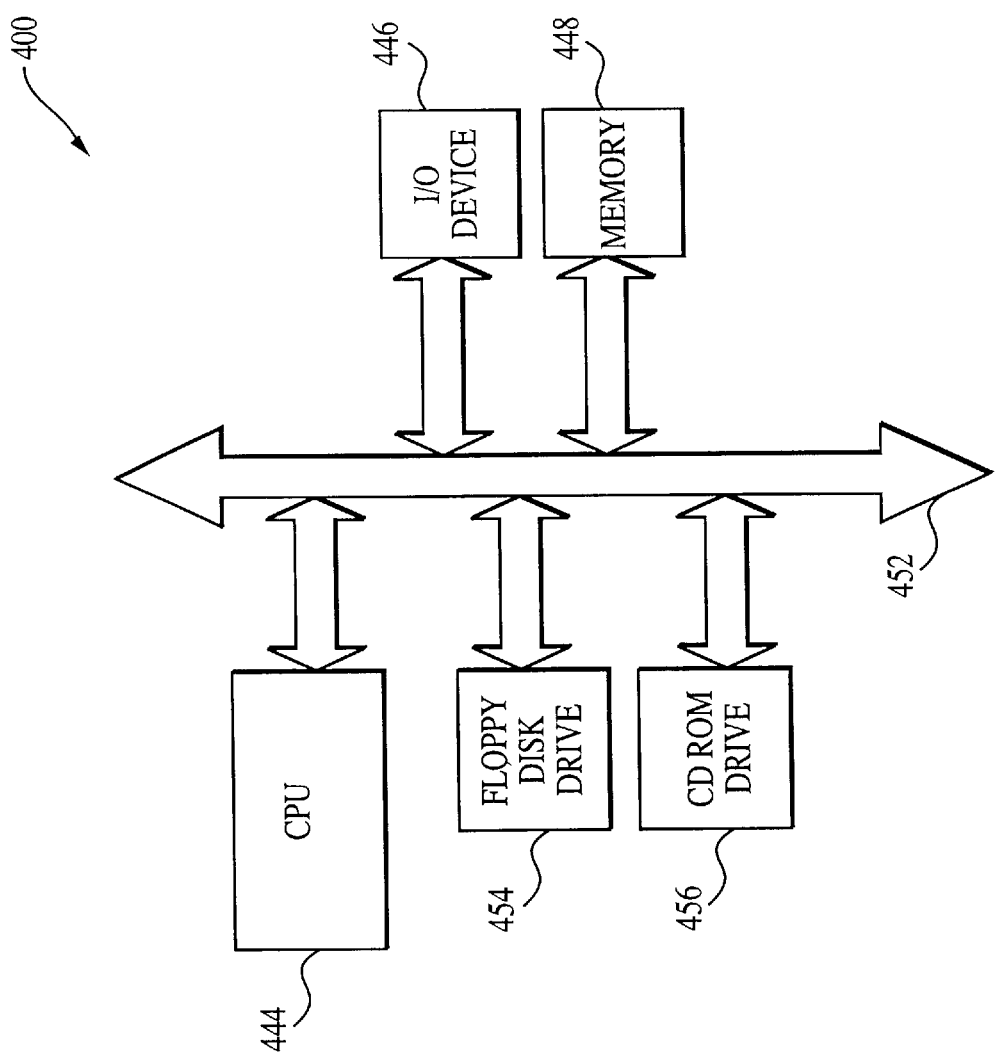
FIG. 14 illustrates a computer system having a memory cell with a gate stack including the ultra-thin gate oxide layer of hafnium oxide ($HfO_2$) formed according to the present invention.

The gate stacks 70 including the ultra-thin hafnium gate oxide (HfO$_2$) layer 62 formed in accordance with embodiments of the present invention could be used in any integrated circuit structure such as in a processor-based system 400 (FIG. 14) which includes a memory circuit 448, for example a memory module containing a plurality of DRAM memory devices 100 having gate stacks comprising the ultra-thin hafnium gate oxide (HfO$_2$) layer 62 formed according to the present invention. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452. The processing unit 444 and other devices illustrated in FIG. 14 may also contain circuits having transistors with gate stacks comprising the ultra-thin hafnium gate oxide (HfO$_2$) layer 62 formed according to the present invention.

Although the invention has been illustrated for a DRAM memory device, such as the DRAM memory device 100 (FIG. 13), fabricated on a p-type substrate, the invention could also be fabricated on an n-type substrate, as well-known in the art. This, of course, will change the doping and conductivity of the operative layers in the fabricated device.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by letters patent of the united states is:

1. A transistor comprising:
   source and drain regions provided in a semiconductor substrate; and
   a gate structure on said semiconductor substrate between said source and drain regions, said gate structure comprising a hafnium oxide layer in contact with said semiconductor substrate and a conductive layer overlying said hafnium oxide layer, wherein said hafnium oxide layer preserves the atomically smooth surface of said semiconductor substrate.

2. The transistor of claim 1, wherein said hafnium oxide layer has a thickness of about 10 Angstroms to about 100 Angstroms.

3. The transistor of claim 2, wherein said hafnium oxide layer has a thickness of about 10 Angstroms to about 50 Angstroms.

4. The transistor of claim 1, wherein said conductive layer is formed of a material selected from the group consisting of metals, metal silicides, polysilicon and metal oxides.

5. The transistor of claim 1, wherein said semiconductor substrate is a silicon substrate.

6. The transistor of claim 5, wherein said silicon substrate has a surface of <100> orientation, said surface being adjacent to said hafnium oxide layer.

7. The transistor of claim 5, wherein said silicon substrate has a surface of <111> orientation, said surface being adjacent to said hafnium oxide layer.

8. The transistor of claim 1 further comprising a silicide layer overlying said conductive layer.

9. A memory device comprising:
   a semiconductor substrate;
   a memory cell access transistor comprising:
   a gate stack fabricated on said semiconductor substrate, said gate stack including a hafnium oxide layer overlying said semiconductor substrate and a conductive layer overlying said hafnium oxide layer, wherein said hafnium oxide layer has a thickness of about 10 Angstroms to about 100 Angstroms; and
   source and drain regions formed in said semiconductor substrate disposed adjacent to said gate stack.

10. The memory device of claim 9, wherein said hafnium oxide layer has a thickness of about 10 Angstroms to about 50 Angstroms.

11. The memory device of claim 9, wherein said conductive layer is formed of a material selected from the group consisting of metals, metal silicides, polysilicon and metal oxides.

12. The memory device of claim 9, wherein said semiconductor substrate is a silicon substrate.

13. The memory device of claim 12, wherein said silicon substrate has a surface of <100> orientation, said surface being adjacent to said hafnium oxide layer.

14. The memory device of claim 12, wherein said silicon substrate has a surface of <111> orientation, said surface being adjacent to said hafnium oxide layer.

15. The memory device of claim 9 further comprising a silicide layer overlying said conductive layer.

16. A processor-based system comprising:
   a processor; and
   an integrated circuit coupled to said processor, at least one of said integrated circuit and processor comprising a transistor, said transistor comprising:
   source and drain regions provided in a silicon substrate; and
   a gate stack fabricated on said silicon substrate, said gate stack including a hafnium oxide layer in contact with said silicon substrate, wherein at least a portion of said silicon substrate in contact with said hafnium oxide layer has a surface of <111> orientation, and a conductive layer overlying said hafnium oxide layer.

17. The processor-based system of claim 16, wherein said hafnium oxide layer has a thickness of about 10 Angstroms to about 100 Angstroms.

18. The processor-based system of claim 17, wherein said hafnium oxide layer has a thickness of about 10 Angstroms to about 50 Angstroms.

19. The processor-based system of claim 16, wherein said conductive layer is formed of a material selected from the group consisting of metals, metal silicides, polysilicon and metal oxides.

20. The processor-based system of claim 16, wherein a second portion of said silicon substrate has a surface of <100> orientation, said surface of said second portion being adjacent to said hafnium oxide layer.

21. The processor-based system of claim 16, further comprising a silicide layer overlying said conductive layer.

22. A gate structure for a semiconductor device comprising:
   a hafnium oxide layer in contact with a semiconductor substrate, said hafnium oxide layer being formed by forming a hafnium layer on said substrate and oxidizing said hafnium layer; and
   a conductive layer over said hafnium oxide layer.

23. The transistor of claim 22, wherein said hafnium oxide layer has a thickness of about 10 Angstroms to about 100 Angstroms.

24. The transistor of claim 22, wherein said semiconductor substrate is a silicon substrate.

25. The transistor of claim 24, wherein at least a portion of said silicon substrate has a surface of <111> orientation, said surface being adjacent to said hafnium oxide layer.

26. The gate structure of claim 22, wherein said conductive layer is formed of a material selected from the group consisting of metals, metal silicides, polysilicon and metal oxides.

27. A transistor comprising:
   source and drain regions provided in a semiconductor substrate; and
   a gate structure on said semiconductor substrate between said source and drain regions, said gate structure comprising a hafnium krypton plasma oxidized layer in contact with said semiconductor substrate and a conductive layer overlying said hafnium oxide layer.

28. The transistor of claim 27, wherein said oxidized hafnium layer has a thickness of about 10 Angstroms to about 100 Angstroms.

29. The transistor of claim 27, wherein said semiconductor substrate is a silicon substrate.

30. The transistor of claim 29, wherein at least a portion of said silicon substrate has a surface of <111> orientation, said surface being adjacent to said oxidized hafnium layer.

31. The transistor of claim 27 further comprising a silicide layer overlying said conductive layer.

32. The transistor of claim 27, wherein said conductive layer is formed of a material selected from the group consisting of metals, metal silicides, polysilicon and metal oxides.

33. A memory device comprising:
   a semiconductor substrate;
   a memory cell access transistor comprising:

a gate stack fabricated on said semiconductor substrate, said gate structure comprising a oxidized thermally evaporated hafnium oxide layer in contact with said semiconductor substrate and a conductive layer overlying said hafnium oxide layer; and source and drain regions formed in said semiconductor substrate disposed adjacent to said gate stack.

34. The memory device of claim 33, wherein said oxidized hafnium layer has a thickness of about 10 Angstroms to about 100 Angstroms.

35. The memory device of claim 33, wherein said semiconductor substrate is a silicon substrate, and wherein at least a portion of a surface of said substrate in contact with said oxidized hafnium layer has a surface of <111> orientation.

36. The memory device of claim 33 further comprising a silicide layer overlying said conductive layer.

* * * * *